US007781872B2

(12) United States Patent
Grey

(10) Patent No.: US 7,781,872 B2
(45) Date of Patent: Aug. 24, 2010

(54) PACKAGE WITH MULTIPLE DIES

(75) Inventor: David Grey, Santa Clara, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 143 days.

(21) Appl. No.: 11/959,800

(22) Filed: Dec. 19, 2007

(65) Prior Publication Data
US 2009/0160036 A1 Jun. 25, 2009

(51) Int. Cl.
H01L 29/72 (2006.01)
(52) U.S. Cl. .................. 257/666; 257/773; 257/783; 257/787
(58) Field of Classification Search ............ 257/666, 257/773, 783, 787
See application file for complete search history.

(56) References Cited

U.S. PATENT DOCUMENTS

| | | |
|---|---|---|
| 3,956,821 A | 5/1976 | Martin |
| 4,058,899 A | 11/1977 | Phy |
| 4,191,943 A | 3/1980 | Cairns et al. |
| 4,680,613 A | 7/1987 | Daniels et al. |
| 4,720,396 A | 1/1988 | Wood |
| 4,731,701 A | 3/1988 | Kuo et al. |
| 4,751,199 A | 6/1988 | Phy |
| 4,772,935 A | 9/1988 | Lawler et al. |
| 4,791,493 A | 12/1988 | Ogura et al. |
| 4,796,080 A | 1/1989 | Phy |
| 4,839,717 A | 6/1989 | Phy et al. |
| 4,890,153 A | 12/1989 | Wu |
| 5,327,325 A | 7/1994 | Nicewarner, Jr. |
| 5,646,446 A | 7/1997 | Nicewarner, Jr. et al. |
| 5,776,797 A | 7/1998 | Nicewarner, Jr. et al. |
| 6,133,634 A | 10/2000 | Joshi |
| 6,329,706 B1 | 12/2001 | Nam |
| 6,424,035 B1 | 7/2002 | Sapp et al. |
| 6,432,750 B2 | 8/2002 | Jeon et al. |
| 6,465,276 B2 | 10/2002 | Kuo |
| 6,566,750 B1 | 5/2003 | Sofue et al. |
| 6,574,107 B2 | 6/2003 | Jeon et al. |
| 6,621,152 B2 | 9/2003 | Choi et al. |

(Continued)

OTHER PUBLICATIONS

Exhibit A which was identified in the 37 CFR 1.131 Declaration filed on Feb. 12, 2010.*

(Continued)

*Primary Examiner*—Edward Wojciechowicz
(74) *Attorney, Agent, or Firm*—Townsend and Townsend and Crew LLP

(57) ABSTRACT

A semiconductor die package is disclosed. It includes a leadframe structure comprising a first die attach pad and a second die attach pad. A plurality of leads extend from the first and second die attach pads. The plurality of leads includes at least a first control lead and a second control lead. A first semiconductor die including a first device is mounted on the first die attach pad, and a second semiconductor die has a second device is mounted on the second die attach pad. A housing is provided in the semiconductor die package and protects the first and second dies. The housing may have an exterior surface and at least partially covers the first semiconductor die and the second semiconductor die. The first control lead and the second control lead are at opposite sides of the semiconductor die package.

13 Claims, 5 Drawing Sheets

U.S. PATENT DOCUMENTS

| | | |
|---|---|---|
| 6,627,991 B1 | 9/2003 | Joshi |
| 6,645,791 B2 | 11/2003 | Noquil et al. |
| 6,674,157 B2 | 1/2004 | Lang |
| 6,683,375 B2 | 1/2004 | Joshi et al. |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,774,465 B2 | 8/2004 | Lee et al. |
| 6,777,800 B2 | 8/2004 | Madrid et al. |
| 6,806,580 B2 | 10/2004 | Joshi et al. |
| 6,830,959 B2 | 12/2004 | Estcio |
| 6,836,023 B2 | 12/2004 | Joshi et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,061,077 B2 | 6/2006 | Joshi et al. |
| 7,061,080 B2 | 6/2006 | Jeun et al. |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,196,313 B2 | 3/2007 | Quinones et al. |
| 7,199,461 B2 | 4/2007 | Son et al. |
| 7,208,818 B2 * | 4/2007 | Luo et al. .................. 257/666 |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,268,414 B2 | 9/2007 | Choi et al. |
| 7,271,497 B2 | 9/2007 | Joshi et al. |
| 7,285,849 B2 | 10/2007 | Cruz et al. |
| 7,315,077 B2 | 1/2008 | Choi et al. |
| 7,332,806 B2 | 2/2008 | Joshi et al. |
| 2009/0121330 A1 | 5/2009 | Cruz |

OTHER PUBLICATIONS

Exhibit B which was identified in the 37 CFR 1.131 Declaration filed on Feb. 12, 2010.*

"Dual N-Channel 30-V (D-S) MOSFET with Schottky Diode"; 2002, Vishay Siliconix, document No. 72035, pp. 1-9.

* cited by examiner

PACKAGE WITH MULTIPLE DIES

BACKGROUND OF THE INVENTION

A number of semiconductor die packages for power MOSFETs (metal oxide semiconductor field effect transistors) exist.

While existing semiconductor die packages are useful, a number of improvements can be made. For example, it would be desirable if semiconductor die packages could be made smaller and could be designed so that they dissipate heat more efficiently. Further, existing lead configurations are not always easy for an OEM (original equipment manufacturers) to use. For example, in some cases, a package may have alternating gate and source leads on one side of package. This alternating configuration can make it more difficult for an OEM to use as it may require more corresponding conductive pads on a circuit substrate. For example, a gate lead in a package is sandwiched between two source leads, then any circuit board that is used to support the package would need to have circuit traces (e.g., pads) that are similarly separated. This makes it difficult for one designing the circuit board. In addition, in some cases, more source leads may be desirable in a package so that greater source current can be provided to the die package.

Embodiments of the invention address the above problems and other problems individually and collectively.

BRIEF SUMMARY

Embodiments of the invention are directed to semiconductor die packages.

One embodiment of the invention is directed to a semiconductor die package comprising a leadframe structure comprising a first die attach pad and a second die attach pad. A plurality of leads extends from the first and second die attach pads. The plurality of leads comprising at least a first control lead and a second control lead. A first semiconductor die comprises a first device and is mounted on the first die attach pad, and a second semiconductor die comprising a second device is mounted on the second die attach pad. A housing is provided in the semiconductor die package and protects the first and second dies. The housing may comprise an exterior surface and at least partially covering the first semiconductor die and the second semiconductor die. The first control lead and the second control lead are at opposite sides of the semiconductor die package. They are preferably at two opposing corner regions of the package, and are along one side region of the package.

Another embodiment of the invention is directed to a semiconductor die package comprising a leadframe structure comprising a first die attach pad and a second die attach pad. A plurality of leads extends from the first and second die attach pads, where the plurality of leads comprises at least a first gate lead and a second gate lead. A first semiconductor die comprising a first MOSFET is mounted on the first die attach pad, and a second semiconductor die comprising a second MOSFET is mounted on the second die attach pad, where the first semiconductor die and the second semiconductor die are connected in series. A housing comprising an exterior surface is provided in the semiconductor die package and at least partially covers the first semiconductor die and the second semiconductor die. The surfaces of the leads are substantially co-planar with the exterior surface of the housing, and the first gate lead and the second gate lead are at opposite sides of the semiconductor die package.

Another embodiment of the invention is directed to a semiconductor die package comprising obtaining a leadframe structure comprising a first die attach pad and a second die attach pad, and plurality of leads extending from the first and second die attach pads. The plurality of leads comprises at least a first control lead and a second control lead. The method also comprises attaching a first semiconductor die comprising a first device to the first die attach pad, attaching a second semiconductor die to comprising a second device to the second die attach pad, and providing a housing comprising an exterior surface on the first semiconductor die and the second semiconductor die to form the semiconductor die package. The first control lead and the second control lead are at opposite sides of the semiconductor die package.

These and other embodiments of the invention are described in further detail below.

BRIEF DESCRIPTION OF THE DRAWINGS

In the Figures, like numerals designate like elements and descriptions of some elements may not be repeated in some instances.

DETAILED DESCRIPTION

A number of specific embodiments of the invention are described in detail below. For example, a single semiconductor die package having two semiconductor dies with two MOSFET, and eight leads is described in detail below. It is understood that embodiments of the invention can include any suitable number of semiconductor dies and/or leads and embodiments of the invention are not limited to the specific embodiments shown in the Figures.

Figure 1:
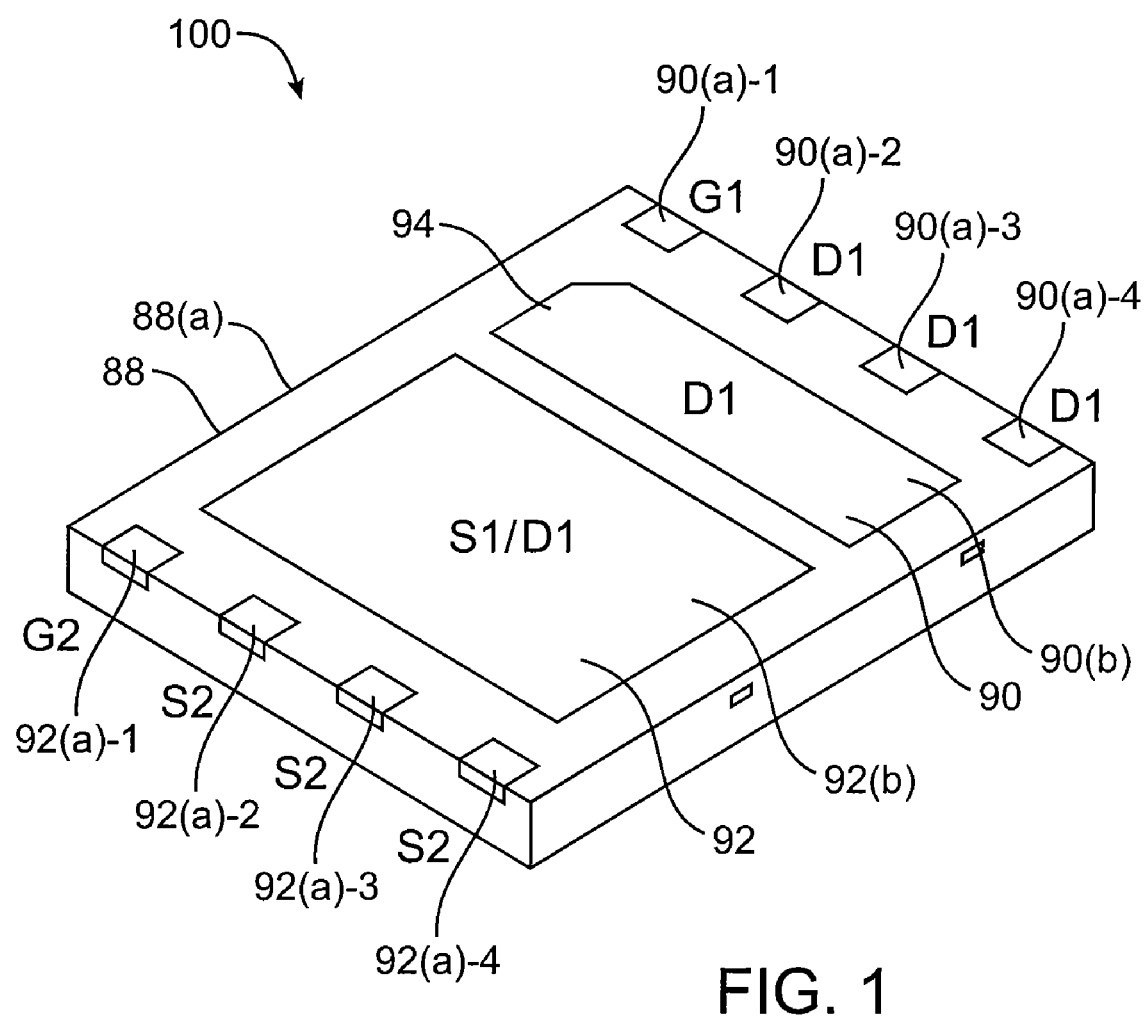
FIG. 1 shows a bottom perspective view of a semiconductor die package according to an embodiment of the invention.

An exemplary semiconductor die package 100 is shown in FIG. 1. It includes a leadframe structure 94 comprising a first leadframe structure portion 90 including a first die attach pad 90(b) and a second leadframe structure portion 92 including a second die attach pad 92(b). The first and second leadframe structure portions 90, 92 may be separated from each other.

The leadframe structures according to embodiments of the invention can be formed using any suitable process. For example, a stamping process (known in the art) could be used to form a leadframe structure. The leadframe structures can also be formed by etching a continuous conductive sheet to form a predetermined pattern. However, if stamping is used, the lead frame may originally be one of many lead frames in an array of lead frames that are connected together by tiebars. During the process of making a semiconductor die package, the lead frame array may be cut to separate the lead frame from other lead frames. As a result of this cutting, portions of a lead frame structure in a final semiconductor die package such as a source lead and a gate lead may be electrically and mechanically uncoupled from each other. Thus, a lead frame structure in a semiconductor die package may be a continuous metallic structure or a discontinuous metallic structure.

The leadframe structures can have other features. For instance, in some embodiments, the leadframe structure 94 includes a number of apertures (not shown). The apertures can be formed using any suitable process including stamping, etching (wet or dry), etc. The leadframe structure 94 can also be coated with one or more layers of material. For example, the leadframe structure 94 may include a base metal such as copper or a copper alloy. The base metal may be coated with one or more underbump metallurgy layers. For example, NiPd may be pre-plated on a copper leadframe. Also, the total thickness of the leadframe structure can vary. For example, in some embodiments, the thickness of the leadframe structure can be about 8 mils thick (or more or less than this).

The semiconductor die package 100 includes a plurality of leads extending from the die attach pads 90(*b*), 92(*b*). It includes a first set of leads 90(*a*)-1, 90(*a*)-2, 90(*a*)-3, 90(*a*)-4 extending from the first die attach pad 90(*b*) and a second set of leads 92(*a*)-1, 92(*a*)-2, 92(*a*)-3, 92(*a*)-4 extending from the second die attach pad 92(*b*). The plurality of leads includes at least a first control lead 90(*a*)-4 and a second control lead 92(*a*)-4.

Figure 2:
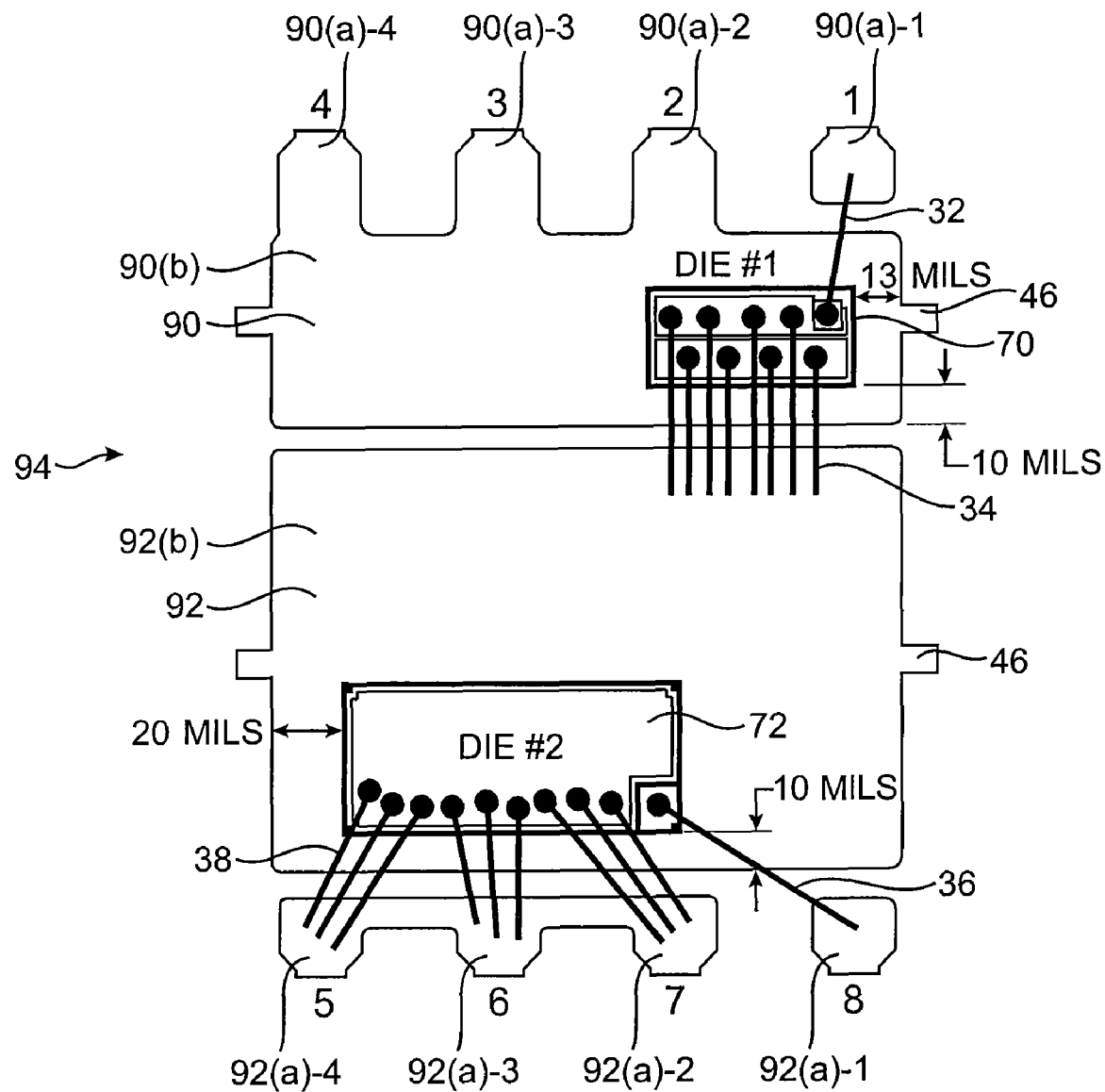
FIG. 2 shows a top view of the package shown in FIG. 1 without a molding material.

Referring to FIG. 2, a first semiconductor die 70 including a first device is mounted on the first die attach pad 90(*b*), and a second semiconductor die 72 including a second device is mounted on the second die attach pad 92(*b*). Tie bar portions 46 are shown as extending from the first and second die attach pads 90(*a*), 90(*b*). These tie bar portions 46 may be used to connect the leadframe structure 94 to other leadframe structures (not shown) in an array of leadframe structures so that many die packages can be produced in parallel.

The semiconductor dies 70, 72 comprise MOSFETs in the illustrated examples, but may comprise any suitable semiconductor device in other embodiments of the invention. Suitable devices may include vertical or horizontal devices. Vertical devices have at least an input at one side of the die and an output at the other side of the die so that current can flow vertically through the die. Horizontal devices include at least one input at one side of the die and at least one output at the same side of the die so that current flows horizontally through the die.

Figure 4:
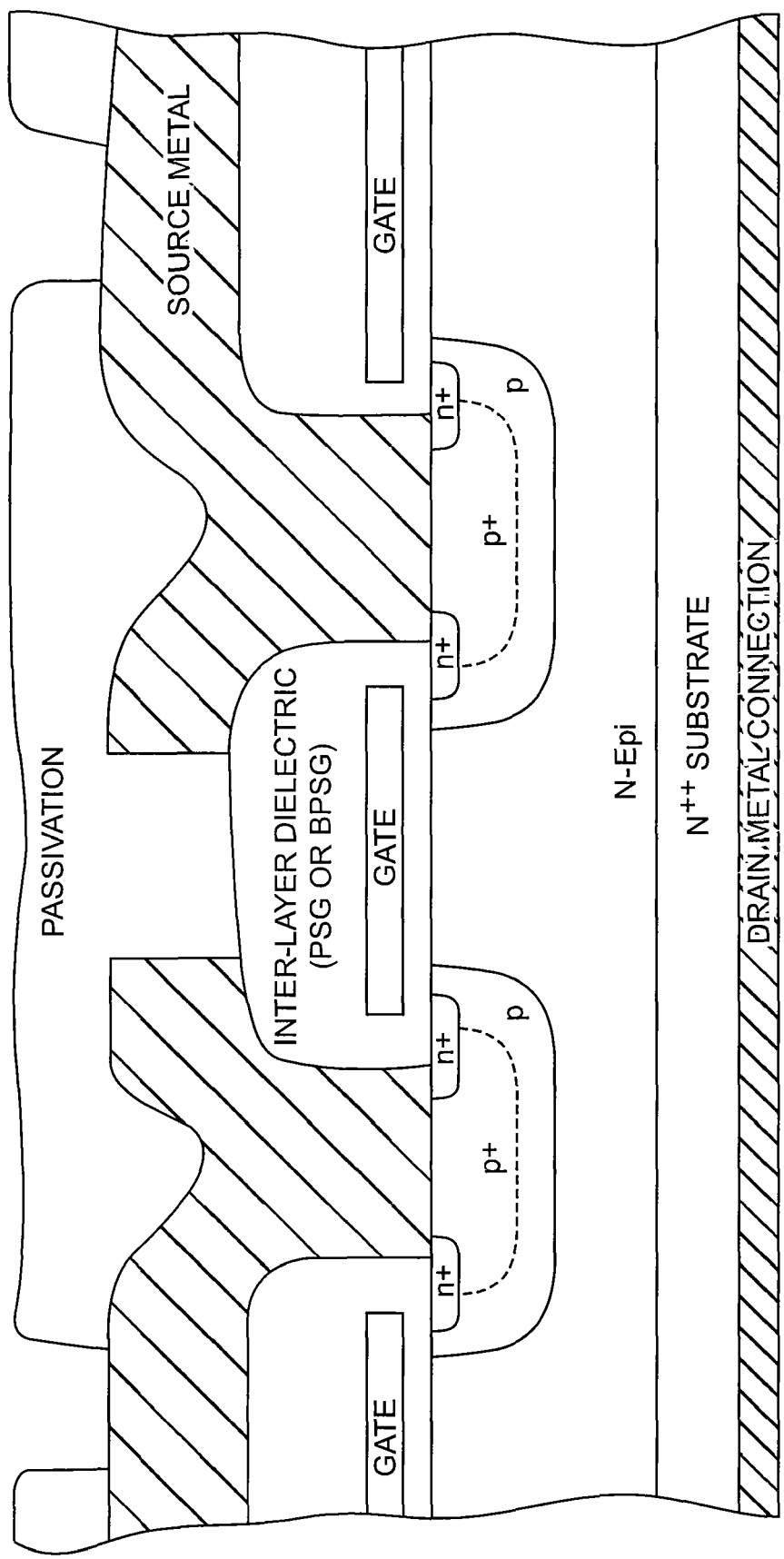
FIG. 4 shows a schematic illustration of a vertical power MOSFET.

Vertical power transistors include VDMOS transistors and vertical bipolar transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. An example of a vertical MOSFET is shown in FIG. 4. While P- or N-channel MOSFETs can be used in embodiments of the invention, N-channel MOSFETs are preferred.

Referring to both FIGS. 1 and 2, a housing 88 is provided in the semiconductor die package 100 and protects the first and second dies 70, 72. The housing 88 may have an exterior surface 88(*a*) and at least partially covers the first semiconductor die 94, the second semiconductor die 72, and the leadframe structure 94.

As shown in FIG. 1, the exterior surface 88(*a*) (which may correspond to a bottom surface of the package 100) of the housing 88 may be substantially coplanar with exterior surfaces of the leads 90(*a*)-1, 90(*a*)-2, 90(*a*)-3, 90(*a*)-4, 92(*a*)-1, 92(*a*)-2, 92(*a*)-3, 92(*a*)-4, as well as exterior surfaces of the die attach pads 90(*b*), 92(*b*). The exterior surfaces of the leads 90(*a*)-1, 90(*a*)-2, 90(*a*)-3, 90(*a*)-4, 92(*a*)-1, 92(*a*)-2, 92(*a*)-3, 92(*a*)-4, and the exterior surfaces of the die attach pads 90(*b*), 92(*b*) may serve as connection terminals for the semiconductor die package 100 when the semiconductor die package 100 is mounted to a circuit substrate such as a printed circuit board. Since the lateral edges of the leads 90(*a*)-1, 90(*a*)-2, 90(*a*)-3, 90(*a*)-4, 92(*a*)-1, 92(*a*)-2, 92(*a*)-3, 92(*a*)-4 do not extend past the lateral surface of the housing 88, the semiconductor die package 100 illustrated in FIG. 1 may be characterized as a "leadless" package. A "leaded" package can be one in which the leads of the package extend past the lateral edges of the housing 88 of the semiconductor die package 100. Embodiments of the invention can include both leaded and leadless packages.

The particular configuration shown in FIG. 1 has a number of advantages. For example, because the housing 88 does not cover the exterior surfaces of the die attach pads 90(*b*), 92(*b*), the semiconductor die package 100 is thin. It also has a small footprint, so the package 100 can be used in small electronic devices such as laptop computers and cell phones. Further, since the die attach pads 90(*b*), 92(*b*) are exposed through the housing 88, heat can be readily dissipated from the semiconductor dies 70, 72, through the exposed die attach pads 90(*a*), 92(*b*), and to a circuit substrate (e.g., a circuit board) that is attached to the package 100.

As shown in FIGS. 1 and 2, the three leads 90(*a*)-2, 90(*a*)-3, 90(*a*)-4 are drain leads and are electrically coupled to a drain terminal in a MOSFET in the first semiconductor die 70 mounted on the die attach pad 90(*b*). The three leads 90(*a*)-2, 90(*a*)-3, 90(*a*)-4 and the die attach pad 90(*b*) may form a unitary body.

The three leads 92(*a*)-2, 92(*a*)-3, 92(*a*)-4 are source leads which are electrically coupled to a source region in a MOSFET in the second semiconductor die 72 through a number of wires 38. The use of three of more source leads provides the package 100 with the ability to use more source current. The drain leads 90(*a*)-2, 90(*a*)-3, 90(*a*)-4 are at the opposite side of the semiconductor die package 100 as the source leads 92(*a*)-2, 92(*a*)-3, 92(*a*)-4.

The semiconductor die package 100 further comprises a first gate lead 90(*a*)-1 coupled to a gate region in a MOSFET in the first semiconductor die 70 using a first wire 32. A second gate lead 92(*a*)-1 is coupled to a gate region in a MOSFET in the second semiconductor die 72 using a second wire 36. The first gate lead 90(*a*)-1 and the second gate lead 92(*a*)-1 can be characterized as a first control lead and the second control lead, respectively. As shown in FIGS. 1 and 2, they are at opposite sides of the semiconductor die package 100. They are also at opposing corner regions of the package 100, and are proximate a single edge region of the package 100.

Referring to FIG. 2, a plurality of bond wires 34 also provide a connection between the source region in the first semiconductor die 70 and the second die attach pad 92, and consequently to the drain region in the second semiconductor die 72. Thus, the drain (or more generically an output) in the second MOSFET in the second semiconductor die 72 is directly connected to the source (or more generically an input) in the MOSFET in the first semiconductor die 70. The second die attach pad 92 can also be directly connected to a pad on a circuit substrate (not shown) to provide a connection to the drain in the second MOSFET in the second semiconductor die 72 and the source in the first MOSFET in the first semiconductor die 70. In this example, there is no lead in the package 100, which connects directly to the drain (or more generically an output) in the second MOSFET in the second semiconductor die 72 or the source in the MOSFET in the first semiconductor die 70.

As shown in FIGS. 1 and 2, the drain leads 90(*a*)-2, 90(*a*)-3, 90(*a*)-4 and the source leads 92(*a*)-2, 92(*a*)-3, 92(*a*)-4 are segregated from each other and the two gate leads 90(*a*)-1, 92(*a*)-2. Because they are segregated, a circuit substrate (e.g., a circuit board) which supports the package 100 can have a greater number of pad configurations. For example, a single large drain pad and a single large source pad on a circuit substrate can be respectively connected to the set of drain leads 90(*a*)-2, 90(*a*)-3, 90(*a*)-4 and the source leads 92(*a*)-2, 92(*a*)-3, 92(*a*)-4. Alternatively, a circuit substrate could have six separate pads connected to the set of drain leads 90(*a*)-2, 90(*a*)-3, 90(*a*)-4 and the set of source leads 92(*a*)-2, 92(*a*)-3, 92(*a*)-4. In comparison, a circuit substrate supporting a package having alternating leads (e.g., gate/source/gate/source) along one side of a package would have to have separate bond pads for each lead. In addition, in a synchronous buck converter application, a single control chip may be mounted on a circuit board with the package 100 and may send signals to both gate leads 90(*a*)-1, 92(*a*)-1 to control gates in MOSFETs in the package 100. Since the gate leads 90(*a*)-1, 92(*a*)-1 are at one side of the semiconductor die package 100, a single control chip (not shown) can be placed adjacent to the gate leads 90(*a*)-1, 92(*a*)-1. Drain and source traces on a circuit substrate connecting to the set of drain leads 90(*a*)-2, 90(*a*)-3, 90(*a*)-4 and the source leads 92(*a*)-2, 92(*a*)-3, 92(*a*)-4 can be easily separated from each other for easy circuit board design.

Also, as shown in FIG. 1, the exposed surface of the first die attach pad 90(*b*) can serve as a drain connection for the MOSFET in the first semiconductor die. The pad 90(*b*) may be directly soldered to a pad on a circuit board. The second die attach pad 92(*b*) can serve as a drain connection for the second semiconductor die and a source connection for the first semiconductor die. The pad 92(*b*) can be directly soldered to a pad on a circuit board if desired. By directly soldering the pads 90(*a*), 92(*b*) to pads on a circuit board, more direct electrical and thermal paths are provided between the dies in the package 100 and the circuit board to which the package 100 would be mounted.

Figure 3:
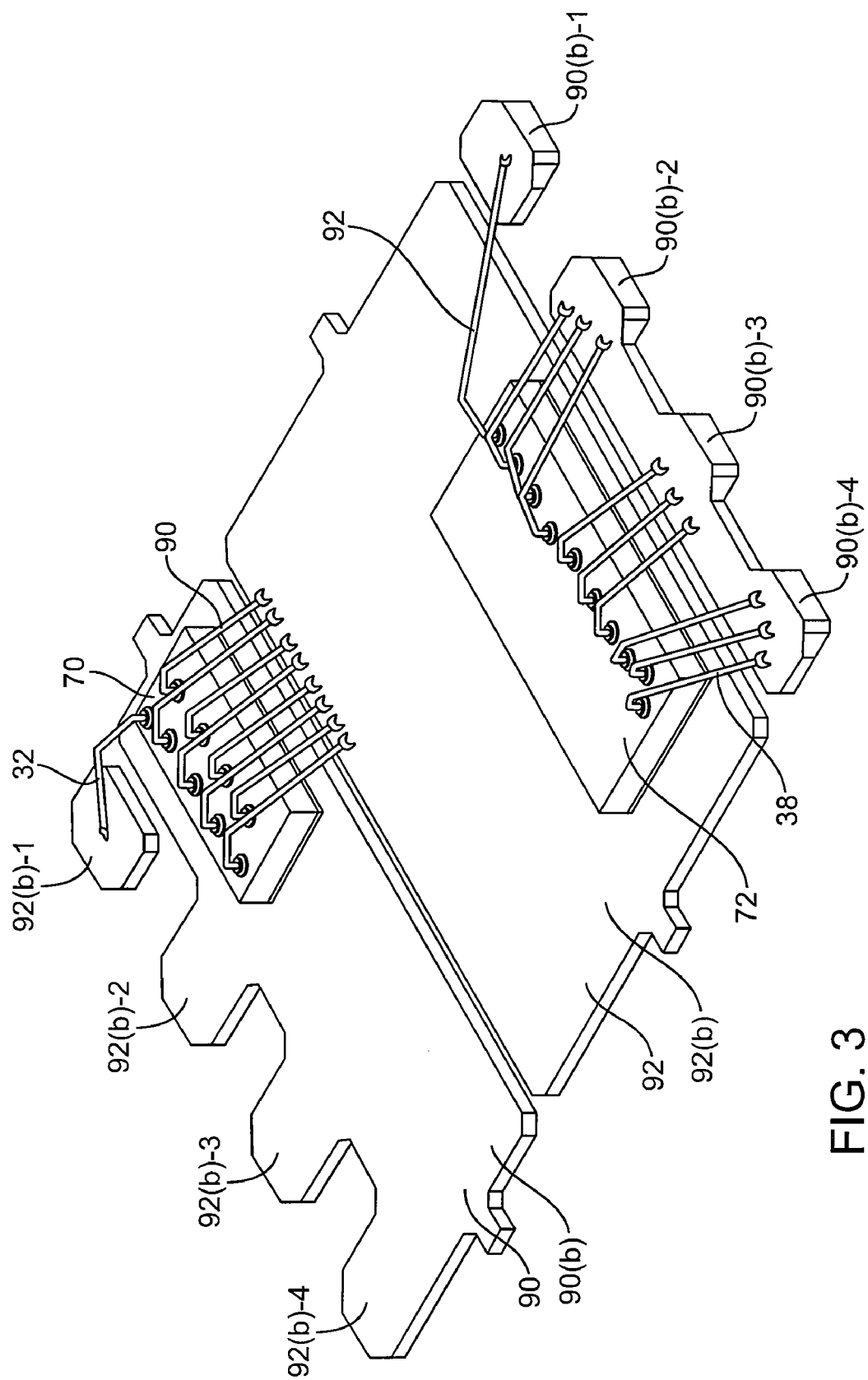
FIG. 3 shows a perspective view of the components shown in FIG. 2.

FIG. 3 shows a perspective view of the components shown in FIG. 2. The components in FIG. 3 have been described above.

Figure 5:
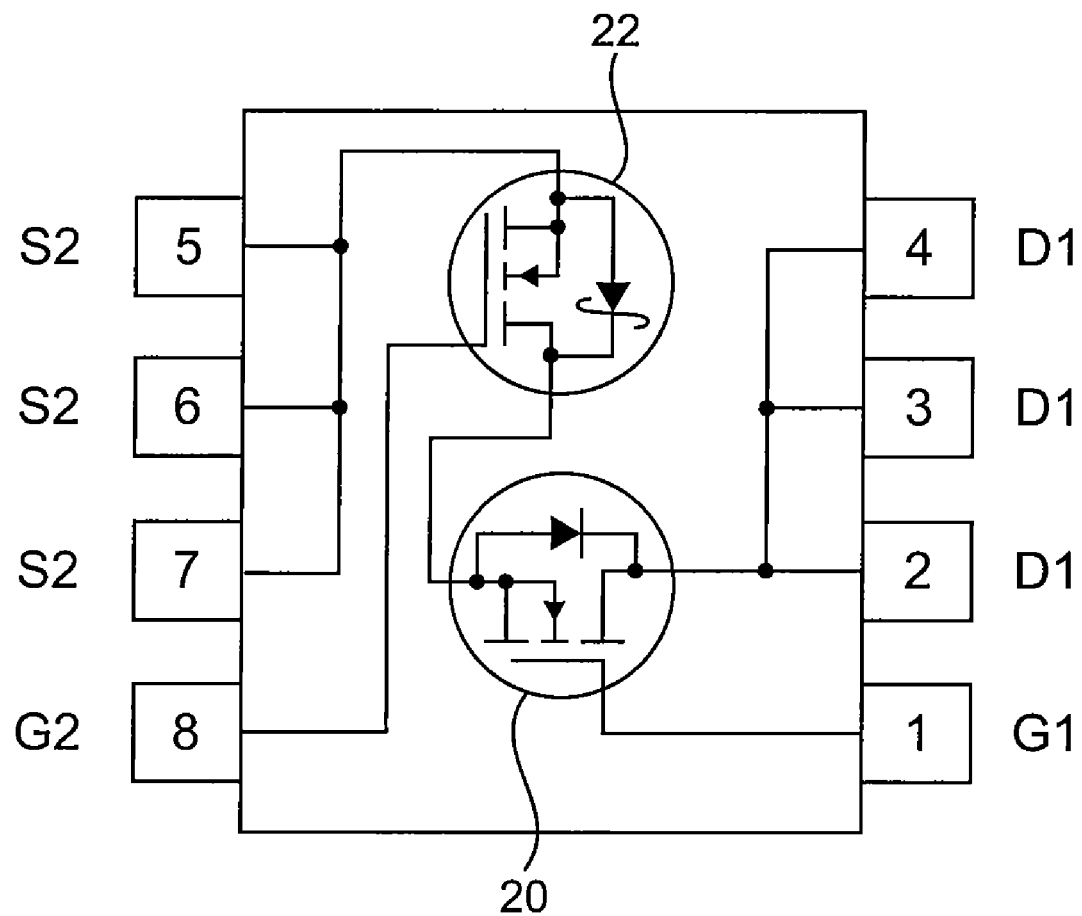
FIG. 5 shows a schematic illustration of a circuit diagram and pin outs in a semiconductor die package.

The packages according to embodiments of the invention can form part of a synchronous buck converter circuit. A synchronous buck converter can use a driver IC, a high-side power MOSFET and a low-side power MOSFET. FIG. 5 shows a simplified schematic diagram of the MOSFETs that can be present in a typical synchronous buck converter. Leads S2 are source leads, leads D1 are drain leads, and leads G1, G2 are gate leads. The synchronous buck converter (SBC) can include a high-side metal oxide semiconductor field effect transistor (MOSFET) 20 and a low-side MOSFET 22. The drain of the low-side MOSFET 22 is electrically connected to the source S of the high-side MOSFET 20.

Another embodiment of the invention is directed to a method for making semiconductor die package. It includes obtaining a leadframe structure comprising a first die attach pad and a second die attach pad, and plurality of leads extending from the first and second die attach pads. The plurality of leads comprises at least a first control lead and a second control lead. The leadframe structure can be obtained commercially or by forming it as described above.

The method also comprises attaching a first semiconductor die comprising a first device to the first die attach pad, and attaching a second semiconductor die to comprising a second device to the second die attach pad. The first semiconductor die and the second semiconductor die can be respectively attached to the first die attach pad and the second die attach pad using a conductive adhesive such as solder (e.g., lead-based solder or lead free solder) or a conductive epoxy.

The method further comprises providing a housing comprising an exterior surface on the first semiconductor die and the second semiconductor die to form the semiconductor die package. In some embodiments, the housing may comprise an molding material (e.g., an epoxy molding material) which may be molded around the dies and the leadframe structure. Various known molding processes can be used. For example, a tape assisted molding process could be used in some embodiments, while a molding tool with molding dies can be used on other embodiments of the invention. If molding is not used, a housing could simply be assembled around the dies and the leadframe structure.

After the housing is formed, the formed package may be separated from other packages processed in a similar manner, and may be tested and marked.

Embodiments of the invention may be used in suitable electrical assemblies where the above-described semiconductor die packages are mounted on a circuit substrate or the like. The electrical assemblies may be present in larger more complex systems including servers, notebook computers, cellular phones, etc.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention. For example, although wires are used in the specific examples, above, conductive clips or other conductive structures could alternatively be used in other embodiments of the invention.

All patent applications, patents and publications noted above are herein incorporated by reference in their entirety for all purposes. None is admitted to be prior art.

Any use of "a", "an", or "the" is intended to mean "one or more" unless specifically indicated to the contrary.

What is claimed is:

1. A semiconductor die package comprising:
   a leadframe structure comprising a first die attach pad and a second die attach pad, and plurality of leads extending from the first and second die attach pads, wherein the plurality of leads comprises at least a first control lead and a second control lead;
   a first semiconductor die comprising a first device mounted on the first die attach pad, wherein the first semiconductor die comprises a first source region and a first drain region opposite the first source region, wherein the first drain region is proximate to the first die attach pad and first source region is distal to the first die attach pad;
   a second semiconductor die comprising a second device mounted on the second die attach pad, wherein the second semiconductor die comprises a second source region and a second drain region opposite the second source region, wherein the second drain region is proximate to the second die attach pad and second source region is distal to the second die attach pad;
   a housing comprising an exterior surface and at least partially covering the first semiconductor die and the second semiconductor die; and
   a conductive structure providing a connection between the source region in the first semiconductor die and the second die attach pad, wherein the first control lead and the second control lead are at opposite sides of the semiconductor die package.

2. The semiconductor die package of claim 1 wherein the first control lead and the second control lead have lateral surfaces that do not extend past the exterior surface of the housing.

3. The semiconductor die package of claim 1 wherein at least one of the first and second devices comprises a vertical power MOSFET.

4. The semiconductor die package of claim 1 wherein the housing comprises a molding material that contacts the first semiconductor die and the second semiconductor die.

5. The semiconductor die package of claim 1 wherein outer surfaces of the die attach pads are exposed through the housing and wherein the outer surfaces are substantially coplanar with the exterior surface of the housing.

6. The semiconductor die package of claim 5 wherein surfaces of the leads in the plurality of leads are substantially coplanar with the exterior surface of the housing.

7. The semiconductor die package of claim 1 wherein the first device and the second device are respectively first and second MOSFETs, wherein the first and second MOSFETs form at least part of a synchronous buck converter circuit.

8. The semiconductor die package of claim 1 wherein the first die attach pad is separated from the second die attach pad, and wherein the first die attach pad serves as a first drain connection for the first device and the second die attach pad serves as a second drain connection for the second die device.

9. A semiconductor die package comprising:
a leadframe structure comprising a first die attach pad and a second die attach pad, and plurality of leads extending from the first and second die attach pads, wherein the plurality of leads comprises at least a first gate lead and a second gate lead;
a first semiconductor die comprising a first MOSFET mounted on the first die attach pad, wherein the first semiconductor die comprises a first source region and a first drain region opposite the first source region, wherein the first drain region is proximate to the first die attach pad and first source region is distal to the first die attach pad;
a second semiconductor die comprising a second MOSFET mounted on the second die attach pad, wherein the second semiconductor die comprises a second source region and a second drain region opposite the second source region, wherein the second drain region is proximate to the second die attach pad and second source region is distal to the second die attach pad;
a housing comprising an exterior surface and at least partially covering the first semiconductor die and the second semiconductor die, wherein surfaces of the leads are substantially co-planar with the exterior surface of the housing; and
a conductive structure providing a connection between the source region in the first semiconductor die and the second die attach pad,
wherein the first gate lead and the second gate lead are at opposite sides of the semiconductor die package.

10. The semiconductor package of claim 9 wherein the plurality of leads comprises a plurality of source leads and a plurality of drain leads, the plurality of source leads being on an opposite side of the package as the plurality of drain leads.

11. The semiconductor package of claim 10 wherein the plurality of source leads comprise three or more source leads and the plurality of drain leads comprises three of more drain leads.

12. The semiconductor die package of claim 1 wherein the conductive structure is a bonding wire.

13. The semiconductor die package of claim 9 wherein the conductive structure is a bonding wire.

* * * * *

UNITED STATES PATENT AND TRADEMARK OFFICE
CERTIFICATE OF CORRECTION

Page 1 of 1

PATENT NO. : 7,781,872 B2
APPLICATION NO. : 11/959800
DATED : August 24, 2010
INVENTOR(S) : David Grey It is certified that error appears in the above-identified patent and that said Letters Patent is hereby corrected as shown below:

In the Drawings:
Sheet 1 of 5, delete "S1/D1" and insert --S1/D2-- as shown below:

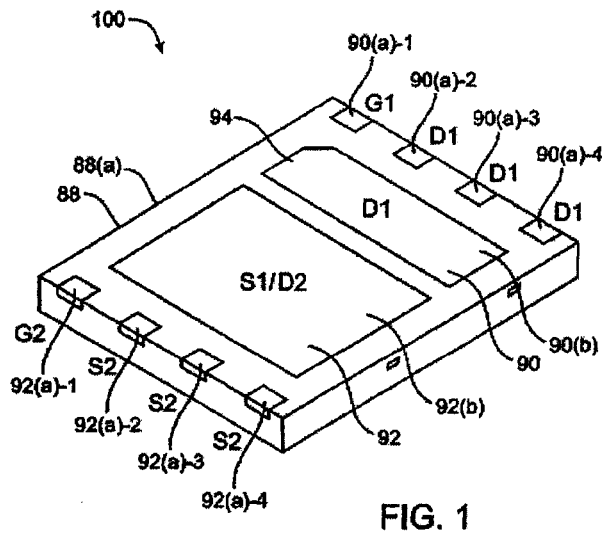

FIG. 1

Signed and Sealed this
Thirty-first Day of July, 2012

David J. Kappos
*Director of the United States Patent and Trademark Office*